(12) United States Patent
Sakanashi et al.

(10) Patent No.: US 11,296,674 B2
(45) Date of Patent: Apr. 5, 2022

(54) QUARTZ CRYSTAL DEVICE

(71) Applicant: NIHON DEMPA KOGYO CO., LTD., Tokyo (JP)

(72) Inventors: Akihiro Sakanashi, Saitama (JP); Hiroki Sekiguchi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 825 days.

(21) Appl. No.: 16/055,169

(22) Filed: Aug. 6, 2018

(65) Prior Publication Data

US 2019/0052245 A1 Feb. 14, 2019

(30) Foreign Application Priority Data

Aug. 8, 2017 (JP) .............................. JP2017-153116

(51) Int. Cl.
*H03H 9/19* (2006.01)
*H03H 9/05* (2006.01)
(Continued)

(52) U.S. Cl.
CPC .......... *H03H 9/19* (2013.01); *H03H 9/02086* (2013.01); *H03H 9/02157* (2013.01);
(Continued)

(58) Field of Classification Search
CPC .... H03H 9/19; H03H 9/0286; H03H 9/02157; H03H 9/0509; H03H 9/0519; H03H 9/1021
See application file for complete search history.

(56) References Cited

U.S. PATENT DOCUMENTS

| | | | |
|---|---|---|---|
| 7,915,791 B2* | 3/2011 | Akane | H03H 9/1021 310/348 |
| 2011/0221309 A1* | 9/2011 | Umeki | H03H 9/02023 310/344 |
| 2019/0190485 A1* | 6/2019 | Yamamoto | H03H 9/1021 |

FOREIGN PATENT DOCUMENTS

| | | |
|---|---|---|
| JP | 2004222006 | 8/2004 |
| JP | 2005198237 | 7/2005 |

(Continued)

OTHER PUBLICATIONS

"Office Action of Japan Counterpart Application", dated Feb. 16, 2021, with English translation thereof, pp. 1-8.
(Continued)

*Primary Examiner* — J. San Martin
(74) *Attorney, Agent, or Firm* — JCIPRNET

(57) ABSTRACT

A quartz crystal device includes a crystal element, a container, a conductive adhesive having flexibility, first pillow portions, and a second pillow portion. The first pillow portions hold the crystal element floated from an inner bottom surface of the container at the proximities of the two positions. The second pillow portion opposes the crystal element at a proximity of a second side. The second side opposes the first side of the crystal element. A height of the first pillow portion is represented as h and a length of the first pillow portion in a direction perpendicular to the first side is represented as X1, where the h is 20 μm to 50 μm and the X1 is 150 μm or less. The conductive adhesive covers at least a top surface and a side surface of the first pillow portion. The side surface is in a center side of the crystal element.

6 Claims, 3 Drawing Sheets

(51) Int. Cl.
  *H03H 9/10* (2006.01)
  *H03H 9/02* (2006.01)
  H03H 9/13 (2006.01)
  H03H 3/02 (2006.01)

(52) U.S. Cl.
  CPC ........ *H03H 9/0509* (2013.01); *H03H 9/0519* (2013.01); *H03H 9/0595* (2013.01); *H03H 9/1021* (2013.01); *H03H 9/132* (2013.01); H03H 2003/022 (2013.01)

(56) References Cited

FOREIGN PATENT DOCUMENTS

| | | |
|---|---|---|
| JP | 2007274339 | 10/2007 |
| JP | 4314826 | 8/2009 |
| JP | 2017005673 | 1/2017 |
| JP | 2017130827 | 7/2017 |
| TW | 201206064 | 2/2012 |

OTHER PUBLICATIONS

"Office Action of Taiwan Counterpart Application", dated Sep. 11, 2020, with English translation thereof, p. 1-p. 11.
"Office Action of Japan Counterpart Application", dated Aug. 17, 2021, with English translation thereof, pp. 1-10.

* cited by examiner

QUARTZ CRYSTAL DEVICE

CROSS-REFERENCE TO RELATED APPLICATIONS

This application is based on and claims priority under 35 U.S.C. § 119 to Japanese Patent Application No. 2017-153116, filed on Aug. 8, 2017, the entire content of which is incorporated herein by reference.

TECHNICAL FIELD

This disclosure relates to a quartz crystal device having a structure in which a crystal element is fixed to a container with an adhesive, for example, a quartz crystal device, such as a crystal resonator, a crystal oscillator including a crystal resonator, and a crystal resonator with a temperature sensor, such as a thermistor and a PN diode.

DESCRIPTION OF THE RELATED ART

There is one kind of the crystal resonators that has a structure in which a crystal element including an excitation electrode is fixed to a predetermined container with an adhesive having a conductive property. Since it is fatal if the crystal element delaminates from the container in this kind of crystal resonator, the countermeasures have been conventionally taken.

For example, Japanese Unexamined Patent Application Publication No. 2007-274339 discloses a device for fixing a crystal element to a holder of a ceramic container including the ceramic holder with a silicone-based conductive adhesive. That is, there is disclosed a structure in which the holder has a top surface including a wiring pattern connected to an excitation electrode of the crystal element and an electrodeless portion that exposes the ceramic, and the silicone-based conductive adhesive is disposed in a state of striding across the wiring pattern and the electrodeless portion (for example, the claims and FIG. 4). In the case of this structure, the silicone-based conductive adhesive is adhered to the ceramic itself as well. The silicone-based conductive adhesive has a better adhesion to a ceramic surface than to a wiring pattern surface; therefore, it is said that a delamination of the crystal element from the holder can be made difficult to occur.

However, in the case of the crystal resonator disclosed in Japanese Unexamined Patent Application Publication No. 2007-274339, it is necessary that the silicone-based conductive adhesive be applied across the wiring pattern and the ceramic surface. Accordingly, it is necessary to secure a wide area for the electrodeless portion to some extent in order to prevent the delamination and it is necessary to secure a wide area for the wiring pattern to some extent in order to secure an electrical conductivity; therefore, a planar surface onto which the conductive adhesive is applied naturally widens. On the other hand, in order to make a property of the crystal resonator better, fixation positions of the crystal element to the holder are preferred to be in a region as far as possible from a vibration center of the crystal element and narrow. In the case of the above-described conventional structure, achieving them is difficult since it is necessary to widen the planar surface onto which the conductive adhesive is applied. The above-described problem gets more serious as downsizing of the crystal resonator advances.

A need thus exists for a quartz crystal device which is not susceptible to the drawback mentioned above.

SUMMARY

According to an aspect of this disclosure, there is provided a quartz crystal device that includes a crystal element, a container, a conductive adhesive having flexibility, first pillow portions, and a second pillow portion. The crystal element has a planar shape in a square shape. The container houses the crystal element. The conductive adhesive having flexibility fixes the crystal element to the container at two positions at proximities of a first side of the crystal element and near both ends of the first side. The first pillow portions hold the crystal element floated from an inner bottom surface of the container at the proximities of the two positions. The second pillow portion opposes the crystal element at a proximity of a second side. The second side opposes the first side of the crystal element. A height of the first pillow portion is represented as h, and a length of the first pillow portion in a direction perpendicular to the first side is represented as X1, where the h is 20 μm to 50 μm and the X1 is 150 μm or less. The conductive adhesive covers at least a top surface and a side surface of the first pillow portion. The side surface is in a center side of the crystal element.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
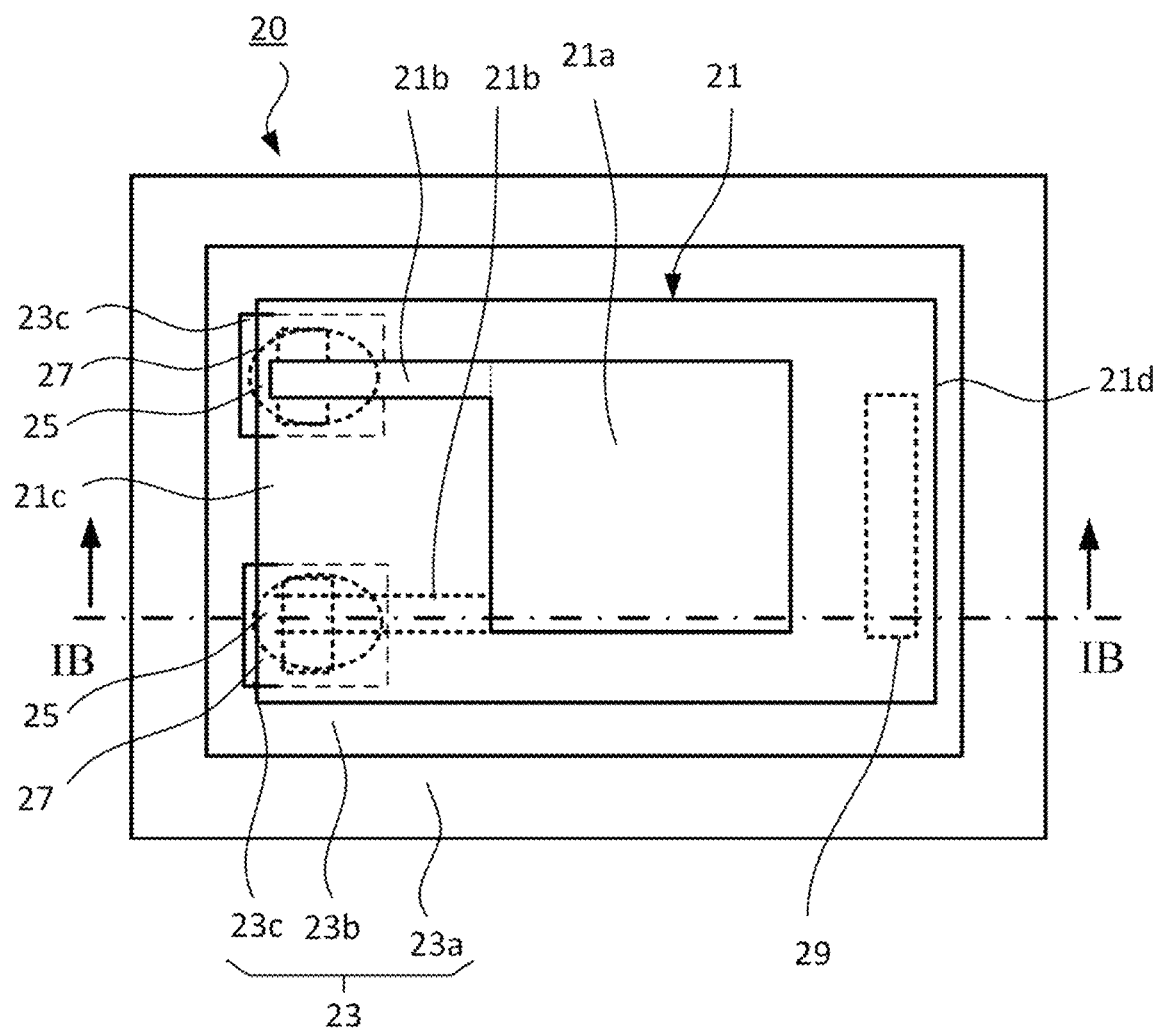
FIG. 1A and FIG. 1B are explanatory drawings of a crystal resonator 20 according to a first embodiment.

The following describes embodiments of a crystal resonator according to the disclosure with reference to drawings. Each drawing used in the descriptions is merely illustrated schematically for understanding the embodiments. In each drawing used in the descriptions, like reference numerals designate corresponding or identical elements, and therefore such elements will not be further elaborated in some cases. Shapes, dimensions, materials, and similar factor described in the following embodiments are merely preferable examples within the scope of the disclosure. Therefore, the disclosure is not limited to only the following embodiments.

1. First Embodiment

1-1. Crystal Resonator According to First Embodiment

Figure 1B:
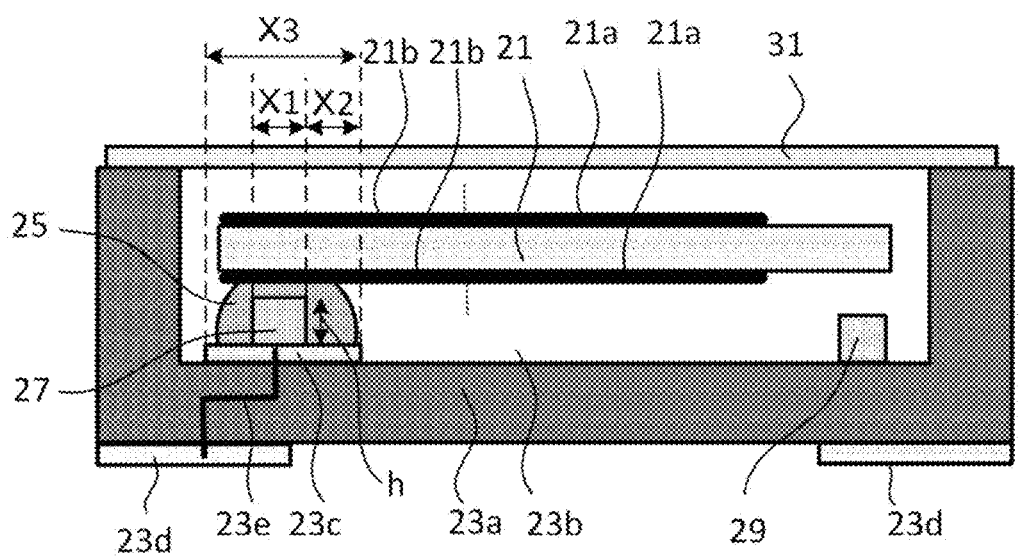

FIG. 1A and FIG. 1B are drawings describing a crystal resonator 20 according to a first embodiment. In particular, FIG. 1A is a plan view of the crystal resonator 20 and FIG. 1B is a cross-sectional view of the crystal resonator 20 taken along the line IB-IB in FIG. 1A.

The crystal resonator 20 includes a crystal element 21, a container 23, conductive adhesives 25 having flexibility, first pillow portions 27, a second pillow portion 29, and a lid member 31 (illustrated only in FIG. 1B).

The crystal element 21 includes excitation electrodes 21a and extraction electrodes 21b. A crystal member of the crystal element 21 itself has a planar shape in a square shape, and in this example, in a rectangular shape. The crystal member of the crystal element 21 itself is what is called a twice-rotated blank typified by, for example, an AT-cut blank and an SC-cut blank. The crystal element 21 in this example is a crystal element having a uniform thickness.

The excitation electrodes 21a are disposed on principal surfaces in the front and back of the crystal element 21. The extraction electrodes 21b are extracted to respective both ends at proximities of a first side 21c, which is one side of short sides of the crystal element 21, and along this first side 21c from the respective excitation electrodes 21a.

The container 23 includes a container body 23a, a depressed portion 23b, wiring patterns 23c, external connecting terminals 23d, and via-wirings 23e. The depressed portion 23b can house the crystal element 21 and is in a square shape in plan view. The wiring pattern 23c is connected to the extraction electrode 21b of the crystal element 21 via the conductive adhesive 25 having flexibility. The wiring patterns 23c are constituted of thin film patterns of metal and disposed at two positions in one end side on a bottom surface of the depressed portion 23b. That is, the wiring patterns 23c are disposed in respective regions near one short side of the container 23 on the bottom surface of the depressed portion 23b and corresponding to both ends of this short side. The external connecting terminals 23d are disposed on an external bottom surface of the container body 23a and connect the crystal resonator 20 to any electronic equipment. The wiring patterns 23c and the external connecting terminals 23d are connected using the via-wirings 23e disposed in the container body 23a. The container 23 can be constituted of, for example, a ceramic package.

The conductive adhesive 25 having flexibility typically is a silicone-based conductive adhesive. However, it is not limited to this, any substance with a physical property similar to this will do. Installation positions and similar matter of this conductive adhesive 25 will be described later.

The first pillow portions 27 and the second pillow portion 29 are disposed at respective predetermined positions on the bottom surface of the depressed portion 23b of the container 23. Specifically, the first pillow portion 27 is disposed on the bottom surface of the depressed portion 23b and in a part of the region of the wiring pattern 23c. When the first pillow portion 27 has a height h and a length X1 in a direction perpendicular to the first side 21c (see FIG. 1B), h is set to a value selected from 20 μm to 50 μm and X1 is set to 150 μm or less, and the reason will be described later. The conductive adhesive 25 having flexibility is disposed so as to cover at least a top surface and a side surface of this first pillow portion 27. This side surface is in a center side of the crystal element. This forms a portion of the conductive adhesive, which is the conductive adhesive 25 having flexibility, having a thickness exceeding 20 μm in a side of the first pillow portion 27, and this side is in the center side of the crystal element 21 (see the portion indicated by X2 in FIG. 1B). However, in the case of this embodiment, the conductive adhesive 25 is also disposed so as to cover portions other than the top surface and the side surface of the first pillow portion 27 in the center side of the crystal element 21.

On the other hand, the second pillow portion 29 is disposed in a region opposing near a second side 21d that opposes the first side 21c of the crystal element 21. The region is on the bottom surface of the depressed portion 23b. This second pillow portion 29 preferably has a height of a value selected from a proportion of, for example, 0.5 to 1.5 with respect to the height of the first pillow portion 27.

Each of the first pillow portions 27 and the second pillow portion 29 is formed when the container 23 is manufactured. Specifically, the first pillow portions 27 and the second pillow portion 29 are formed by printing an alumina paste or a conductive paste by screen printing and sintering it when the ceramic package is formed. Recently, since there has been attempted to form the ceramic package by a molding method, the first pillow portions 27 and the second pillow portion 29 may be formed by molding. Preferably, the first pillow portion 27 has conductive property. This is because it is advantageous for electrically connecting the silicone-based conductive adhesive 25 to the wiring pattern 23c.

The lid member 31 contacts the container 23 on the top surface of a dike portion surrounding the depressed portion 23b of the container 23 and seals the container 23. This lid member 31 is constituted of any one corresponding to a sealing method.

In the embodiment, the crystal element 21, the first pillow portions 27, and the second pillow portion 29 are disposed as described above, the height h and length X1 of the first pillow portion 27 are set to the predetermined values, and the conductive adhesive 25 having flexibility covers the first pillow portion 27 in the predetermined state.

Accordingly, this crystal resonator 20 ensures obtaining the structure in which the conductive adhesive 25 having flexibility is in a thick state having the thickness exceeding 20 μm and located in the side of the first pillow portion 27 in the center side of the crystal element 21. Therefore, even when the crystal element 21 receives an external force with which a side of the second pillow portion 29 is lifted upward with a portion near the first pillow portion 27 as a fulcrum, the flexibility of the conductive adhesive 25 functions stronger than the external force; therefore, the delamination of the crystal element 21 is less likely to occur compared with the conventional one. On the other hand, even when the crystal element 21 receives an external force with which the second pillow portion 29 side is swung downward with the portion near the first pillow portion 27 as a fulcrum, a swing width of the crystal element 21 is restricted by the second pillow portion 29; therefore, the delamination of the crystal element caused by the downward external force is also less likely to occur compared with the conventional one. Since the length X1 of the first pillow portion 27 is set to 150 μm or less, it is possible to prevent the first pillow portion 27 itself from becoming unnecessarily long in a direction along the direction of the length X1. Therefore, it is also possible to prevent application areas of the conductive adhesive from increasing.

While the length X1 of this first pillow portion 27 is mentioned to be 150 μm or less, the length X1 is better to be shorter as long as the first pillow portion 27 can functions as a pillow. This is because the shorter the length X1 is, the easier it is to secure the region where the thick conductive adhesive remains in the sides of the first pillow portion 27. According to an examination by the inventor, the length X1 is, for example, 50 μm to 150 μm, preferably 50 μm to 120 μm, and more preferably 50 μm to 100 μm.

1-2. Working Examples and Comparative Example of First Embodiment

The following sample of a working example 1, sample of a working example 2, and sample of a comparative example were each fabricated to conform to the structure of the first embodiment described above. Then, occurrence rates of the delamination of the crystal element were compared. Differences of each sample are shown in Table 1 below. A delamination testing condition and an evaluation method are described below. That is, the crystal resonator 20 mounted on a predetermined tool is dropped to a floor from a position at a height of 3 m for fifty times. The property of the crystal resonator is checked at every drop to analyze ones that do not provide the property and examine a quantity of the delamination of the crystal element. All the samples of the working examples and the comparative example use an AT-cut crystal element having a long side dimension of approximately 900 μm and a short side dimension of approximately 700 μm as the crystal element 21.

TABLE 1

|  | WORKING EXAMPLE 1 | WORKING EXAMPLE 2 | COMPARATIVE EXAMPLE |
|---|---|---|---|
| LENGTH X1 | 140 | 150 | 150 |
| LENGTH X2 | 40 | 35 | 35 |
| LENGTH X3 | 220 | 220 | 220 |
| THICKNESS OF WIRING PATTERN | 10 | 10 | 10 |
| HEIGHT h OF FIRST PILLOW PORTION | 20 | 30 | 10 |
| HEIGHT OF SECOND PILLOW PORTION | 20 | 20 | 20 |
| QUANTITY OF DELAMINATION OCCURRENCE | 0 | 0 | 3 |

UNIT OF DIMENSION: μm
QUANTITY OF SAMPLE: TWENTY FOR EACH STANDARD

As can be seen from the result shown in Table 1, while the sample of the comparative example had three delamination occurrences of the crystal element, the samples of the working example 1 and the working example 2 had no delamination occurrence of the crystal element. Accordingly, under the condition where the length X1 of the first pillow portion is 150 μm or less, making the height h of the first pillow portion 27 20 μm or more is considered to prevent the delamination of the crystal element. An upper limit of the height h is preferred to be 50 μm. This is because when the height h is too high, an undesirable phenomenon, such as decreased margin in a height direction when the crystal element 21 is implemented in the container 23, happens. According to the above-described result and an examination by the inventor, the size of the crystal element 21 preferred for applying the present embodiment is the long side dimension of 1000 μm or less and the short side dimension of 900 μm or less, preferably the long side dimension of 900 μm or less and the short side dimension of 800 μm or less, and more preferably the long side dimension of 900 μm or less and the short side dimension of 700 μm or less.

2. Other Embodiments 2-1. Second Embodiment

Figure 2A:
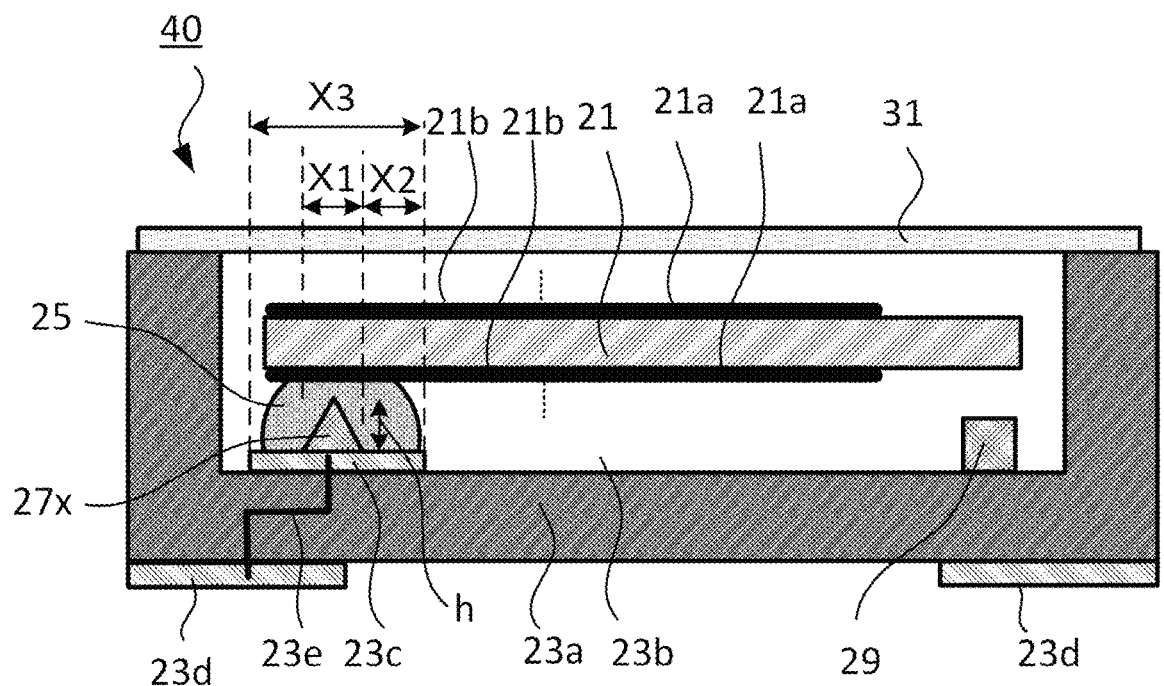
FIG. 2A is an explanatory drawing of a crystal resonator 40 according to a second embodiment.

FIG. 2A is a drawing describing a crystal resonator 40 according to a second embodiment and illustrating the crystal resonator 40 using a cross-sectional view similar to that of FIG. 1B.

While the crystal resonator 20 according to the first embodiment uses the pillow portion with the square-shaped cross-sectional surface along the direction of its length X1 as the first pillow portion 27, the crystal resonator 40 according to this second embodiment uses a pillow portion with a triangular-shaped cross-sectional surface along a direction of its length X1 as a first pillow portion 27x. When the first pillow portion 27x with the triangular cross-sectional shape is used, a formation region of the conductive adhesive in sides of the first pillow portion 27x widens along oblique side portions in the triangular shape; therefore, it is considered that a contribution effect of the flexibility of the conductive adhesive 25 having flexibility is more enhanced compared with the first pillow portion 27 having the cross-sectional shape in a square shape.

2-2. Third Embodiment

Figure 2B:
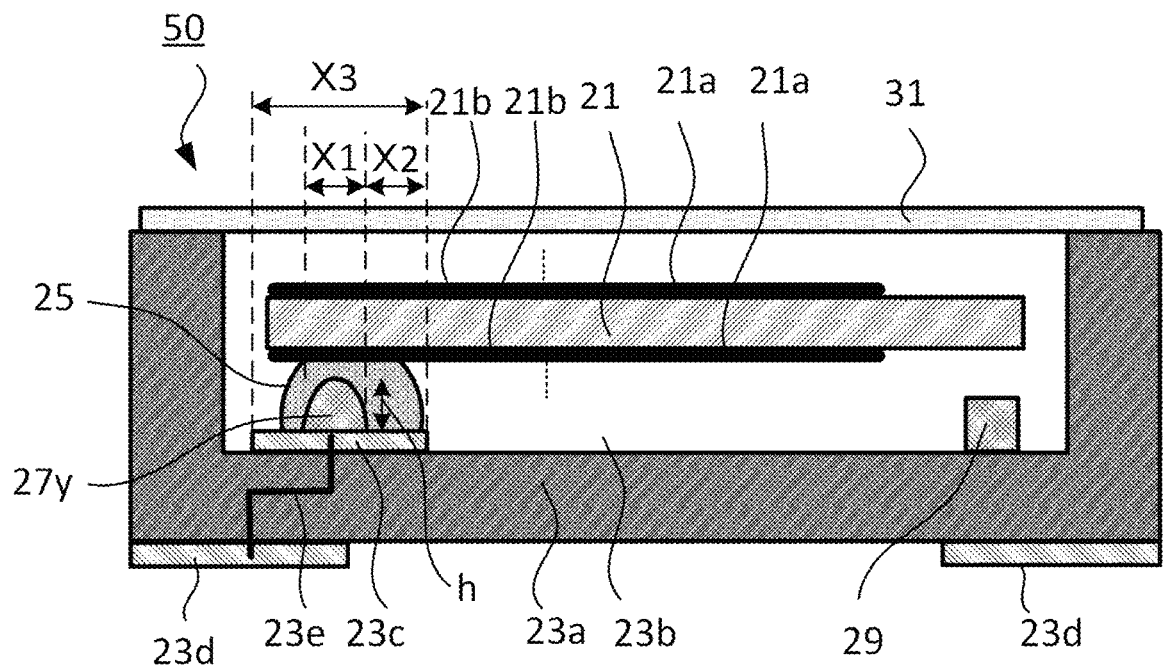
FIG. 2B is an explanatory drawing of a crystal resonator 50 according to a third embodiment.

FIG. 2B is a drawing describing a crystal resonator 50 according to a third embodiment and illustrating the crystal resonator 50 using a cross-sectional view similar to that of FIG. 1B.

While the crystal resonator 20 according to the first embodiment uses the pillow portion with the square-shaped cross-sectional surface along the direction of its length X1 as the first pillow portion 27, the crystal resonator 50 according to this third embodiment uses a pillow portion with a cross-sectional surface in an upwardly convexed hemispherical shape along the direction of its length X1 as a first pillow portion 27y. When the first pillow portion 27y with the upwardly convexed hemispherical cross-sectional shape is used, a formation region of the conductive adhesive in sides of the first pillow portion 27y widens along a spherical surface portion; therefore, it is considered that a contribution effect of the flexibility of the conductive adhesive 25 having flexibility is more enhanced compared with the first pillow portion 27 having the cross-sectional shape in a square shape. The hemispherical shape here includes a shape of a non-true hemisphere, such as a hemispherical shape of an ellipsoid, as well as a shape of a true hemisphere.

While some embodiments are described above, the embodiment can make the following changes. While the crystal element with uniform thickness is used as the crystal element 21, the embodiment is applicable to a crystal element having what is called a bevel shape as with a thickness of an end portion of the crystal element being thinner than a thickness of the center. While the example using the container having the depressed portion 23b as the container 23 is described, the embodiment is applicable to a crystal resonator having a sealing structure with a plate-shaped container body and a cap-shaped lid member.

In the respective embodiments described above, while it is shown the examples where the first pillow portions 27, 27x, and 27y are arranged in the center along the direction of the length X1 with respect to the wiring pattern 23c, the arrangement may have the first pillow portion decentered to a wall side of the container with respect to the wiring pattern, that is, the arrangement may have the enlarged length X2 in FIG. 1B. This ensures the wide area of the sides of the first pillow portion 27 in the center side of the crystal element, thereby easily enhancing the delamination prevention effect of the conductive adhesive.

The quartz crystal device according to the embodiment has a structure in which the height of the first pillow portion is 20 μm to 50 μm and the conductive adhesive having flexibility covers the predetermined region of this first pillow portion in the predetermined direction; therefore, the structure has the conductive adhesive having the flexibility and the thickness more than 20 µm is located in the side of the first pillow portion in the center side of the crystal element. Therefore, the flexibility of this thick conductive adhesive functions as a drag force against the external force with which the crystal element is lifted upward with the proximity of the first pillow portion as a fulcrum. Since the second pillow portion is disposed, when the crystal element is swung downward with the proximity of the first pillow portion as a fulcrum, its swing width is restricted by the second pillow portion. Based on these, the delamination of the crystal element can be made less likely to occur compared with the conventional ones.

In order to make the property of the crystal resonator better, the conductive adhesive is preferred to be disposed at the position as far as possible from the center of the crystal element and in a small area. In such a case, when the dimension X1 of the first pillow portion in the direction perpendicular to the first side is made too large, the application region of the conductive adhesive in the side of the first pillow portion easily gets close to the center of the crystal element and the application amount has to be reduced in order not to make the distance close. However, maintaining the dimension X1 150 µm or less ensures an appropriate application position and area of the conductive adhesive in the side of the first pillow portion.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A quartz crystal device, comprising:
   a crystal element, having a planar shape in a square shape;
   a container that houses the crystal element;
   a conductive adhesive having flexibility that fixes the crystal element to the container at two positions at proximities of a first side of the crystal element and near both ends of the first side;
   wiring patterns, being constituted of thin film patterns of metal and disposed at each of two regions for fixing the crystal element to the container;
   first pillow portions that hold the crystal element floated from an inner bottom surface of the container at the proximities of the two positions, wherein the first pillow portions are provided on a part of a region of the wiring patterns and are constituted of a sintered product of a conductive paste; and
   a second pillow portion that opposes the crystal element at a proximity of a second side, the second side opposing the first side of the crystal element,
   wherein a height of the first pillow portion is represented as h, a length of the first pillow portion in a direction perpendicular to the first side is represented as X1, where the h is 20 µm to 50 µm and the X1 is 50 µm to 120 µm,
   the second pillow portion has a height of a value selected from a proportion of 0.5 to 1.5 with respect to the height of the first pillow portion,
   the conductive adhesive covers at least a top surface and a side surface of the first pillow portion, the side surface being in a center side of the crystal element,
   the side surface is provided with a portion of the conductive adhesive having a thickness exceeding the h,
   a length in the direction perpendicular to the first side started from an edge of the first pillow portion toward a center side of the crystal element is represented as X2, and a part of the conductive adhesive being provided in the region of the X2 that is at least 35 µm, and
   the crystal element has a long side of 0.90 mm or less and a short side of 0.7 mm or less.

2. The quartz crystal device according to claim 1, wherein the first pillow portion has a cross-sectional shape along a direction perpendicular to the first side in a square shape.

3. The quartz crystal device according to claim 1, wherein the first pillow portion has a cross-sectional shape along a direction perpendicular to the first side in a triangular shape.

4. The quartz crystal device according to claim 1, wherein the first pillow portion has a cross-sectional shape along a direction perpendicular to the first side in an upwardly convexed hemispherical shape.

5. The quartz crystal device according to claim 1, wherein the X1 is 50 µm to 100 µm, but excluding 100 µm.

6. The quartz crystal device according to claim 1, wherein the conductive adhesive having flexibility is a silicone-based conductive adhesive.

* * * * *